United States Patent
Renner et al.

(10) Patent No.: US 8,195,972 B2
(45) Date of Patent: Jun. 5, 2012

(54) JITTER PRECORRECTION FILTER IN TIME-AVERAGE-FREQUENCY CLOCKED SYSTEMS

(75) Inventors: Karl Renner, Dallas, TX (US); Walter Heinrich Demmer, Nuremberg (DE); Liming Xiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 430 days.

(21) Appl. No.: 12/628,339

(22) Filed: Dec. 1, 2009

(65) Prior Publication Data

US 2011/0131439 A1    Jun. 2, 2011

(51) Int. Cl.
G06F 1/00    (2006.01)
G06F 1/04    (2006.01)
G06F 11/00   (2006.01)
H03L 7/06    (2006.01)

(52) U.S. Cl. ........ 713/401; 713/400; 713/500; 713/503; 386/204; 327/149; 327/156

(58) Field of Classification Search .......... 713/400, 713/401, 500, 503; 386/204, 355; 327/149, 327/156
See application file for complete search history.

(56) References Cited

U.S. PATENT DOCUMENTS

| | | | |
|---|---|---|---|
| 4,987,491 A * | 1/1991 | Kaite et al. | 348/497 |
| 6,329,850 B1 | 12/2001 | Mair et al. | |
| 6,940,937 B2 | 9/2005 | Xiu et al. | |
| 7,065,172 B2 | 6/2006 | Xiu et al. | |
| 7,356,107 B2 | 4/2008 | Xiu et al. | |
| 7,372,340 B2 | 5/2008 | Xiu et al. | |
| 7,549,101 B2 * | 6/2009 | Chiba | 714/744 |
| 2003/0118142 A1 | 6/2003 | Xiu et al. | |
| 2004/0179638 A1 * | 9/2004 | Yoshikawa | 375/354 |
| 2005/0193355 A1 * | 9/2005 | Hildebrant et al. | 716/6 |
| 2007/0055718 A1 | 3/2007 | Xu et al. | |
| 2007/0230551 A1 * | 10/2007 | Nakano | 375/226 |
| 2008/0021944 A1 | 1/2008 | Xiu | |

OTHER PUBLICATIONS

Mair et al., "An Architecture of High-Performance Frequency and Phase Synthesis", J. Solid State Circ., Vo. 35, No. 16 (IEEE, Jun. 2000), pp. 835-846.
Xiu, "The Concept of Time-Average-Frequency and Mathematical Analysis of Flying-Adder Frequency Synthesis Architecture", IEEE Circuits and Systems Magazine, vol. 8, No. 3 (Third Quarter 2008), pp. 27-51.
Xiu, "A Novel DCXO Module for Clock Synchronization in MPEG2 Transport System", IEEE Trans. on Circuits and Systems, vol. 55, No. 8 (Sep. 2008), pp. 2226-2237.

* cited by examiner

Primary Examiner — Mark Connolly
(74) Attorney, Agent, or Firm — Robert D. Marshall, Jr.; Wade James Brady, III; Frederick J. Telecky, Jr.

(57) ABSTRACT

Synchronous circuitry for processing digital data in which the data are filtered to compensate for expected jitter in time-average frequency clock signals. Time-average frequency synthesis circuitry generates internal clock signals of a desired frequency, for example as based on a recovered clock signal from an input data stream, in a manner in which not all periods of the clock signal are of uniform duration. A jitter precorrection filter is inserted into the data path to apply a variable delay to pre-correct for distortion caused by jitter in the clock cycle. In embodiments of the invention using a flying-adder architecture to generate the clock signal, coefficients of the digital filer realizing the jitter precorrection filter are calculated according to the currently-selected oscillator phase and according to a fractional portion of a digital frequency control word.

18 Claims, 9 Drawing Sheets

US 8,195,972 B2

JITTER PRECORRECTION FILTER IN TIME-AVERAGE-FREQUENCY CLOCKED SYSTEMS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of electronic systems, and is more specifically directed to synchronous operation of such systems.

As is fundamental in the art, many modern electronic systems include numerous electronic functions that operate in conjunction with one another. These functions may be embodied in multiple integrated circuits that communicate with one another, or may be integrated into a single large-scale integrated circuit in a form commonly referred to in the art as a "System-on-Chip" (SoC). In such systems, activity within each integrated circuit or electronic function is often coordinated by clock signals that are generated on-chip. In larger-scale electronic systems, each function typically has its own clock frequency requirement, yet the multiple functions in the overall system communicate with one another in a synchronous or clocked manner. For example, consumer-oriented systems such as televisions and home theaters include video decoders for decoding an input video signal into digital video output signals that are synchronized with a synchronization pulse contained within the incoming video signal itself. Modern spread-spectrum communications transmitters and receivers require the generation of high-frequency clock signals for the modulation and demodulation, respectively, of signals over the multiple subchannels of the spread spectrum bandwidth. In these and other electronic systems, the generation of periodic signals for clocking the operation of circuit functions based upon a system clock or synchronization pulse, is a common and often critical function.

A conventional approach for generating periodic signals based upon a reference clock utilizes the well-known phase-locked loop ("PLL"). In general, PLL circuits operate by comparing the time at which an edge of a reference clock is received with a corresponding edge of an internally generated clock, and generating an error signal that is used to adjust the generated clock signal to better match the received reference clock. The goal of these conventional PLLs, whether implemented in analog or digital form, is to generate a periodic clock signal of the desired frequency.

In recent years, significant advances in the field of clock generation include clock generator circuits that generate a clock signal at the desired frequency but considered as an average over time. In other words, each period of the generated clock signal is not necessarily the same as others, but rather the generated clock periods average out over time to the desired frequency. Many digital systems can use time-average-frequency-based clock signals with little or no deleterious effect on system performance. By removing the constraint that each cycle of the generated clock signal must have the same period, the clock generation circuitry can be implemented in a much more efficient and robust manner, and largely in the digital domain.

Examples of clock generator circuits that incorporate a "flying-adder" architecture operating according to the time-average-frequency concept, and system applications of such circuits, are described in Mair and Xiu, "An Architecture of High-Performance Frequency and Phase Synthesis", *J. Solid State Circ.*, Vo. 35, No. 16 (IEEE, June, 2000), pp. 835-46; commonly assigned U.S. Pat. No. 6,329,850 B1; commonly assigned U.S. Pat. No. 6,940,937 B2; commonly assigned U.S. Pat. No. 7,065,172 B2; commonly assigned U.S. Pat. No. 7,356,107 B2; commonly assigned U.S. Pat. No. 7,372,340 B2; U.S. Patent Application Publication No. US 2007/0055718 A1; and U.S. Patent Application Publication No. US 2008/0021944 A1; all such documents incorporated herein by this reference.

A rigorous mathematical treatment of the concept of time-average-frequency clock generation, and more specifically of the flying-adder architecture for synthesizing signals according to that concept, is provided in Xiu, "The Concept of Time-Average-Frequency and Mathematical Analysis of Flying-Adder Frequency Synthesis Architecture", *IEEE Circuits and Systems Magazine*, Vol. 8, No. 3 (Third Quarter 2008), pp. 27-51, incorporated herein by reference.

FIG. 1 illustrates a simple example of a clock generator circuit (frequency synthesizer) constructed according to the "flying-adder" architecture. In this example, a conventional phase-locked loop shown as PLL 4 generates multiple evenly-spaced (by duration $\Delta$) VCO phases VCO_PH, at a frequency that is locked to a reference frequency generated by frequency reference 2. Frequency reference 2 may be implemented as a crystal oscillator or other reference external to PLL 4. Frequency synthesizer 10 includes multiplexer 6, which has multiple inputs, each receiving one of the multiple output phases VCO_PH generated by a voltage controlled oscillator (VCO) within PLL 4. Multiplexer 6 selects one of VCO phases VCO_PH for coupling to its output in response to a digital value received at its select input. This select value is generated by accumulator 8 within frequency synthesizer 10, more specifically from the integer portion of the contents of accumulator 8. Accumulator 8 sums the value of digital frequency control word FREQ with its current contents (integer and fractional), and stores that sum in its integer and fractional portions. The integer portion of the contents of accumulator 8 constitutes the select input of multiplexer 6, and thus indicates the desired VCO phase to be applied to the clock input of D-type flip-flop 9, which is configured to generate alternating levels at its output on line CLKOUT in response to each received clock edge.

In this arrangement, the pulse width of each half-cycle of clock CLKOUT amounts to the delay $\Delta$ between adjacent phases VCO_PH times the incremental difference in successive integer values output by accumulator 8. As described in the above-incorporated articles, patents, and patent publications, some desired frequencies for the generated time-average-frequency clock signal require a digital control word value that necessarily includes a non-zero fractional portion. As a result, the accumulator in the flying-adder architecture will periodically generate a carry-in from its fractional portion to its integer portion. As the fractional portion of the contents of accumulator 8 rolls over to generate a carry into the integer portion, the incremental difference in successive integer values output by accumulator 8 (and thus the duration between edges of the phase selected by multiplexer 6) increases from that of the previous cycle. The resulting output clock signal in the cycle (or half-cycle) corresponding to that carry-in event will necessarily be prolonged from the previous cycle, typically by the duration of one delay Δ between adjacent phases VCO_PH.

FIG. 2 illustrates an example of a system application of frequency synthesizer 10, in the context of a receiver for MPEG2 data streams, for example as may be included within a television set or a set-top box for a television set. In this example, as described in Xiu, "A Novel DCXO Module for Clock Synchronization in MPEG2 Transport System", *IEEE Trans. on Circuits and Systems*, Vol. 55, No. 8 (September 2008), pp. 2226-37, incorporated herein by reference, input data stream DATA/PCR includes the video and audio payload, along with a program clock reference (PCR) serving as a timestamp, and useful for recovering a synchronous clock signal from the data stream. In this system, time stamp processor 12 receives the PCR and generates digital control word FREQ, which is applied to flying-adder synthesizer 10. Flying-adder synthesizer 10 operates as a frequency synthesizer in the manner described above relative to FIG. 1, selecting among the clock phases generated by PLL 4 based on the frequency reference of crystal oscillator 2, as described above. Flying-adder synthesizer 10 generates a clock signal CLKOUT that is applied to RF modulator 14 and DAC 15. Clock signal CLKOUT is intended to have a frequency corresponding to that of the payload data in data stream DATA/PCR, so that processing by RF modulator 14 and DAC 15 is synchronous with that data stream. Nominally, the frequency of clock signal CLKOUT should correspond to the reference frequency from crystal oscillator 2, although the actual clock signal CLKOUT will be generated synchronously with the clock recovered from the PCR.

While the time-averaged frequency of output CLKOUT corresponds to the desired clock frequency (the clock recovered from the input datastream) in this situation, as described above, instantaneous changes in the clock period occur for at least one cycle as the fractional portion of the digital control word FREQ is accumulated and generates carry into the integer portion of the accumulator. More specifically, as described in the Xiu article, consider a frequency control word value FREQ=I+r, where I constitutes the integer portion and r constitutes a non-zero positive-valued fractional portion. The time-average period $T_{avg}$ of the output clock signal will thus be:

$$T_{avg}=(I+r)*\Delta$$

In this case, the output clock signal would have some cycles of a duration I*Δ, and some cycles of a duration (I+1)*Δ, and the rate at which the cycles of duration (I+1)*Δ occur is |r|. For example, if r=0.01, then one cycle of duration (I+1)*Δ will occur in every 100 cycles of the signal on line CLKOUT. Similarly, if r=0.90, then one cycle of duration I*Δ and nine cycles of duration (I+1)*Δ will occur in every ten cycles of the signal CLKOUT. In many system applications, this modulation in instantaneous clock periods has little noticeable effect.

However, it has been observed that this phase modulation can have an undesired impact in applications in which clock signal CLKOUT is used to drive such circuitry as digital-to-analog converters (DACs) and analog-to-digital converters (ADCs), such as in the case of the system of FIG. 2 in which clock signal CLKOUT is clocking the operation of DAC 15. In short, DACs, ADCs, and some other downstream processing circuitry operate on the assumption that the sample times are evenly-spaced, and thus on the assumption that the sample clock has evenly-spaced edges. Deviation from that evenly-spaced condition necessarily causes distortion in the sampled signal, particularly at the high signal frequencies present in the RF output of the MPEG2 video receiver example of FIG. 2.

FIG. 3 illustrates an example of the frequency spectrum of output clock CLKOUT from a conventional flying-adder frequency synthesizer such as that of FIG. 1 in the system of FIG. 2, as measured from the output of DAC 15. In this example, the desired time-averaged signal frequency is 66.75 MHz, which appears as peak 16 in the spectrum of FIG. 3. The offset value corresponding to fractional portion r in this example is −150 ppm. As a result, because of the lengthened cycles that are periodically inserted into the clock signal train, spurious peaks 18 appear on each side of the fundamental output frequency, as shown in FIG. 3. These peaks will be reflected in distortion in the output signal RF_OUT based on the received input datastream, and thus distortion in the displayed audio and video information.

It has been observed, in connection with this invention, that these spurious components in the spectrum of the sampling clock, for example as applied to a high-speed DAC, can result in distortion of high bandwidth data being processed, especially as r becomes large. For example, in those systems such as processing of high frequency composite audio and video signals in an RF modulator, the digital control word (i.e., FREQ) is based on the frequency of a clock that is recovered from the incoming data stream itself. As such, even if the flying-adder synthesizer is designed to minimize phase modulation in its generated clock signal, offset relative to the nominal frequency will still generally be present in the actual signal (i.e., r≠0), resulting in undesirable distortion in the processed signal.

As described in the Xiu article incorporated by reference above, randomization techniques such as dithering have been used to reduce the amplitude of the spurious jitter components (e.g., peaks 18 of FIG. 3). While such randomization in fact reduces those peaks, the noise level of the system and the downstream processing such as sampling is necessarily increased as a result.

BRIEF SUMMARY OF THE INVENTION

Embodiments of this invention provide a system and method in which data processing errors due to cycle-to-cycle phase modulation in the output of time-average-frequency-based clock generation circuits are compensated.

Embodiments of this invention provide such a system and method in which the compensation can be tuned based on performance parameters such as signal-to-noise ratio.

Embodiments of this invention provide such a system and method in which the compensation is accomplished in a manner that lowers the noise floor.

Embodiments of this invention provide such a system and method in which the compensation can be realized as a digital filter.

Embodiments of this invention provide such a system and method in which the compensation filter can be readily bypassed if not needed for a particular frequency.

Embodiments of this invention provide such a system and method in which the compensation can be digitally computed, for example by execution of software program instructions.

Embodiments of this invention provide such a system and method that can be efficiently and flexibly realized in digital form, at low cost and with a high degree of portability among circuit applications.

Other objects and advantages are provided by embodiments of this invention, as will be apparent to those of ordinary skill in the art having reference to the following specification together with its drawings.

Embodiments of this invention may be implemented by way of a jitter precorrection filter inserted in the data path of a system clocked by a time-average-frequency clock source such as a flying-adder frequency synthesizer. The jitter precorrection filter can be realized as an all-pass variable delay digital filter over the frequency range of interest. In embodiments of the invention, the jitter precorrection filter is an FIR polyphase digital filter of a selected order, with its coefficients calculated according to the selected phase from the flying-adder frequency synthesizer and on the fractional portion of the frequency control word applied to the flying-adder frequency synthesizer. Distortion caused by the periodic prolonged clock cycles of the flying-adder frequency synthesizer is thus precorrected prior to sampling and downstream processing at the synthesized clock rate.

DETAILED DESCRIPTION OF THE INVENTION

This invention will be described in connection with one or more of its embodiments. By way of example, these embodiments of the invention will be described as implemented into a video receiver, because it is contemplated that this invention is especially beneficial when applied in such systems and other similar systems. However, it is further contemplated, and it will be apparent to those skilled in the art having reference to this specification, that this invention can provide important benefits and advantages if implemented in other functions and applications beyond that described in this specification. Accordingly, it is to be understood that the following description is provided by way of example only, and is not intended to limit the true scope of this invention as claimed.

Figure 2:
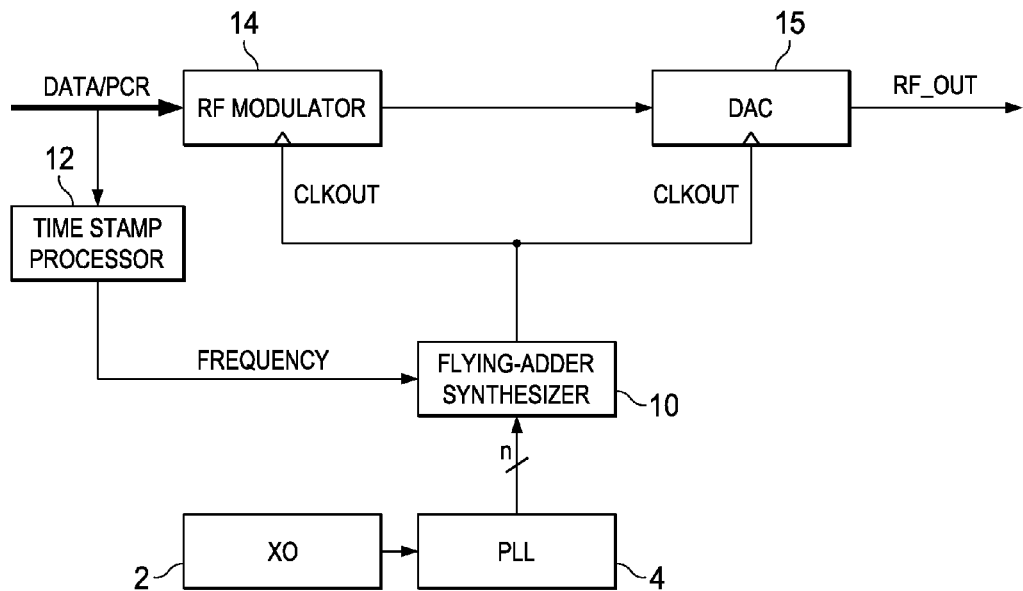
FIG. 2 is an electrical diagram, in block form, of a conventional MPEG2 video receiver including the frequency synthesizer of FIG. 1.
Figure 4:
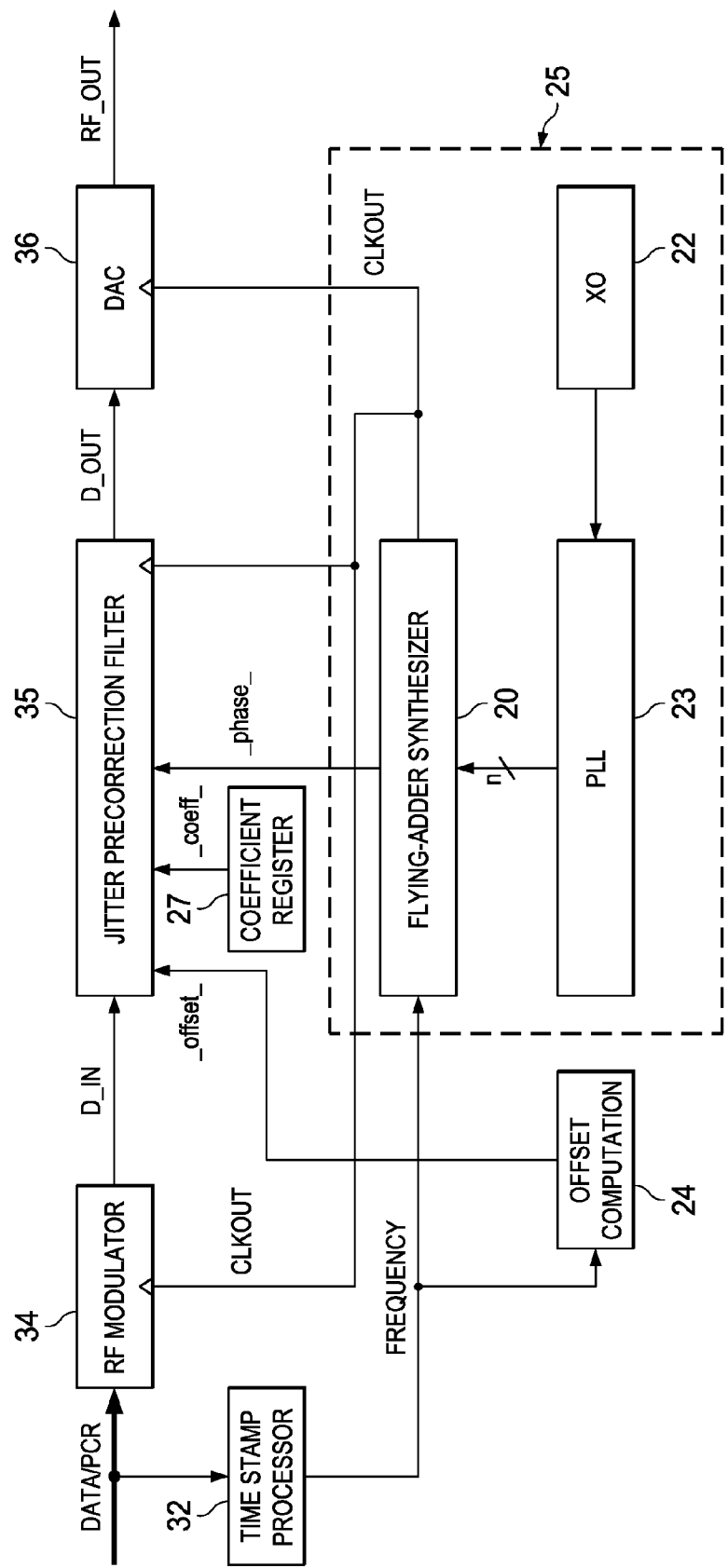
FIG. 4 is an electrical diagram, in block form, of an MPEG2 video receiver constructed according to an embodiment of the invention.

FIG. 4 illustrates a synchronous system constructed according to an embodiment of this invention, in which data processing is clocked by a clock signal of a desired time-average frequency, but in which individual periods of the clock signal are not necessarily of the same duration. In this example, the system of FIG. 4 corresponds to an MPEG2 video receiver, and thus has a similar function as the conventional receiver system described above relative to FIG. 2. The video receiver of FIG. 4 includes a data path, in which the received input data stream DATA/PCR includes video and audio payload, and also includes a program clock reference (PCR) from which a clock signal is recovered for use in processing the payload data. The data path in this case includes RF modulator 34 and digital-to-analog converter (DAC) 36, which in combination produce an analog signal RF_OUT in which the signal payload is modulating an RF carrier of a frequency on the order of 60 to 72 MHz (VHF channels 3 and 4), for example. Each of RF modulator 34 and DAC 36 are clocked by clock signal CLKOUT from time-average frequency synthesis circuit 25, based on a clock recovered from the PCR in the incoming data stream DATA/PCR. More specifically, similarly as in the conventional system of FIG. 2, time stamp processor 32 processes the PCR in the incoming data stream DATA/PCR to identify and retrieve the source clock information contained in that data stream. Time stamp processor 32 communicates that identified information to time-average frequency synthesis circuit 25 as digital control word FREQ, shown in FIG. 4.

Time-average frequency synthesis circuit 25, in this example, is constructed according to the flying-adder architecture described above, and described in further detail in Mair and Xiu, "An Architecture of High-Performance Frequency and Phase Synthesis", *J. Solid State Circ.*, Vo. 35, No. 16 (IEEE, June, 2000), pp. 835-46; Xiu, "The Concept of Time-Average-Frequency and Mathematical Analysis of Flying-Adder Frequency Synthesis Architecture", *IEEE Circuits and Systems Magazine*, Vol. 8, No. 3 (Third Quarter 2008), pp. 27-51; commonly assigned U.S. Pat. No. 6,329,850 B1; commonly assigned U.S. Pat. No. 6,940,937 B2; commonly assigned U.S. Pat. No. 7,065,172 B2; commonly assigned U.S. Pat. No. 7,356,107 B2; commonly assigned U.S. Pat. No. 7,372,340 B2; U.S. Patent Application Publication No. US 2007/0055718 A1; and U.S. Patent Application Publication No. US 2008/0021944 A1; all such documents incorporated herein by this reference. In this embodiment of the invention, time-average frequency synthesis circuit 25 is intended to generate clock signal CLKOUT at a selected desired frequency (e.g., 216 MHz) for operation of downstream digital data processing functions, and should track variations in the actual recovered clock frequency (e.g., 27 MHz) from the PCR.

According to this embodiment of the invention, jitter precorrection filter 35 is inserted in the data path between RF modulator 34 and DAC 36. As will be described in further detail below, jitter precorrection filter 35 processes the output digital data D_IN from RF modulator 34 to compensate or "pre-correct" for the effects of varying-cycle clock jitter inherent in the operation of time-average frequency synthesis circuit 25, more specifically for the effects of individual clock cycles of clock signal CLKOUT having different periods from one another. That varying-cycle clock jitter is referred to in the Xiu article referenced above as "flying-adder cycle prolong", although it will be recognized by those skilled in the art that this periodic flying-adder phase modulation is caused by prolonged cycles. The digital data stream produced by jitter precorrection filter 35, on lines D_OUT, are applied to DAC 36 for sampling and converting to the analog output signal RF_OUT. Jitter precorrection filter 35 is also clocked by clock signal CLKOUT, generated by time-average frequency synthesis circuit 25 based on the recovered clock signal indicated by the PCR of the input datastream.

Figure 5:
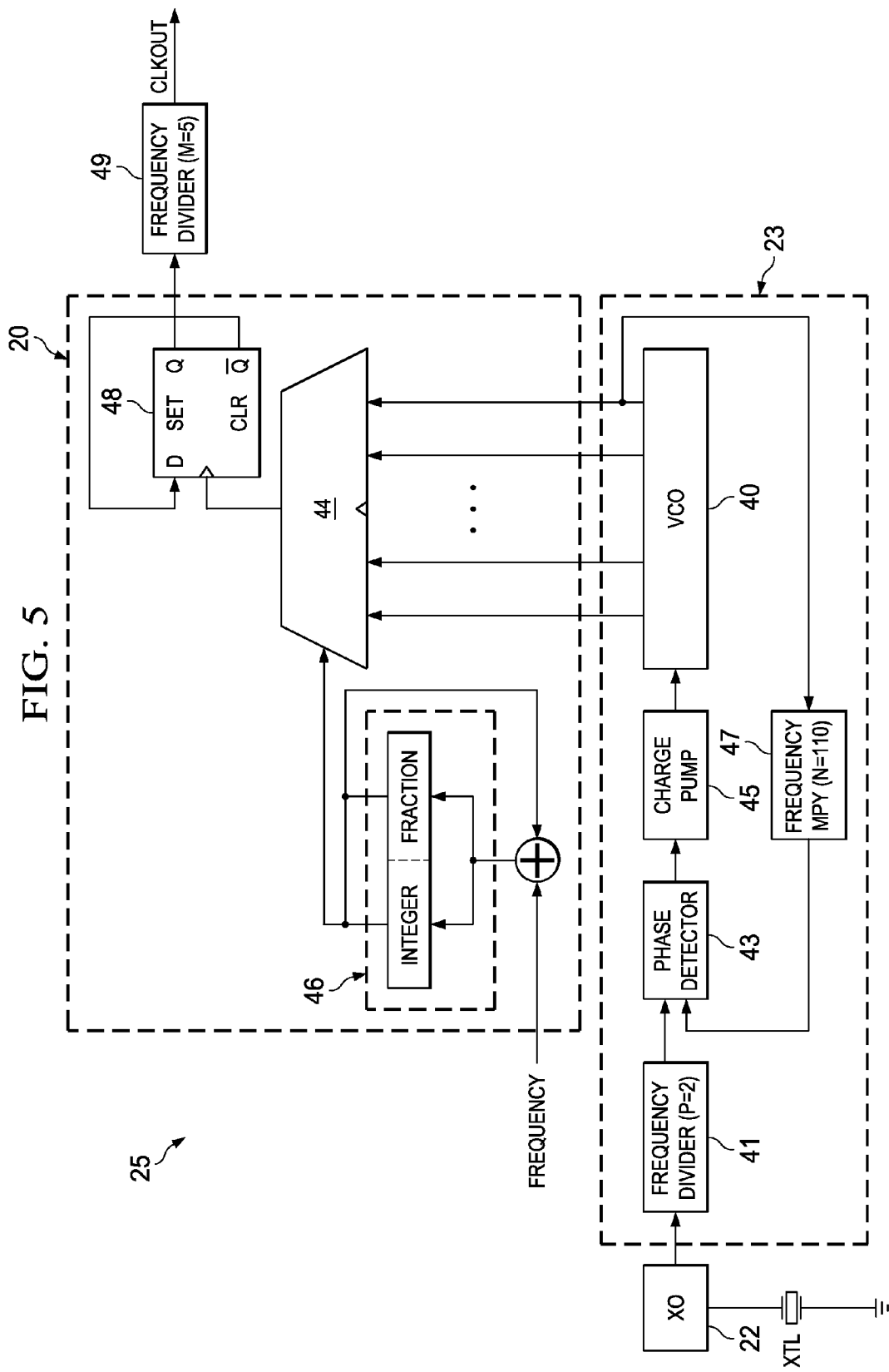
FIG. 5 is an electrical diagram, in block form, of a phase-locked loop and a simplified frequency synthesizer function in the receiver of FIG. 4.

FIG. 5 illustrates an example of the construction of time-average frequency clock generation circuit 25, according to an embodiment of this invention, including a conventional phase-locked loop (PLL) 23 and flying-adder synthesizer 20. Crystal oscillator 22, coupled to external crystal reference XTL, generates a reference clock signal that, after being divided down in frequency by frequency divider 41 (of factor P), is applied to one input of phase detector 43, which receives a feedback signal via frequency multiplier 47 (of factor N) at its other input. Based on the phase difference between edges received at its two inputs, phase detector 43 generates a signal that is applied to charge pump 45. In the conventional PLL manner, the output voltage of charge pump 45, which is responsive to the detected phase difference, is applied to a control input of voltage-controlled oscillator (VCO) 40, which generates output clock signals at a frequency corresponding to the output voltage of charge pump 45. In this embodiment of the invention, in which the output of PLL 23 is applied to flying-adder synthesizer 20, VCO 40 generates multiple phases of its output clock signal (e.g., eight phases). One of those output phases is used as feedback to phase detector 43, via frequency multiplier 47. As a result of this construction, as well-known in the art, the operation of PLL 23 essentially stabilizes at an operating point such that the output frequency from VCO 40 is at a desired multiple N/P of the frequency defined by crystal XTL.

Figure 1:
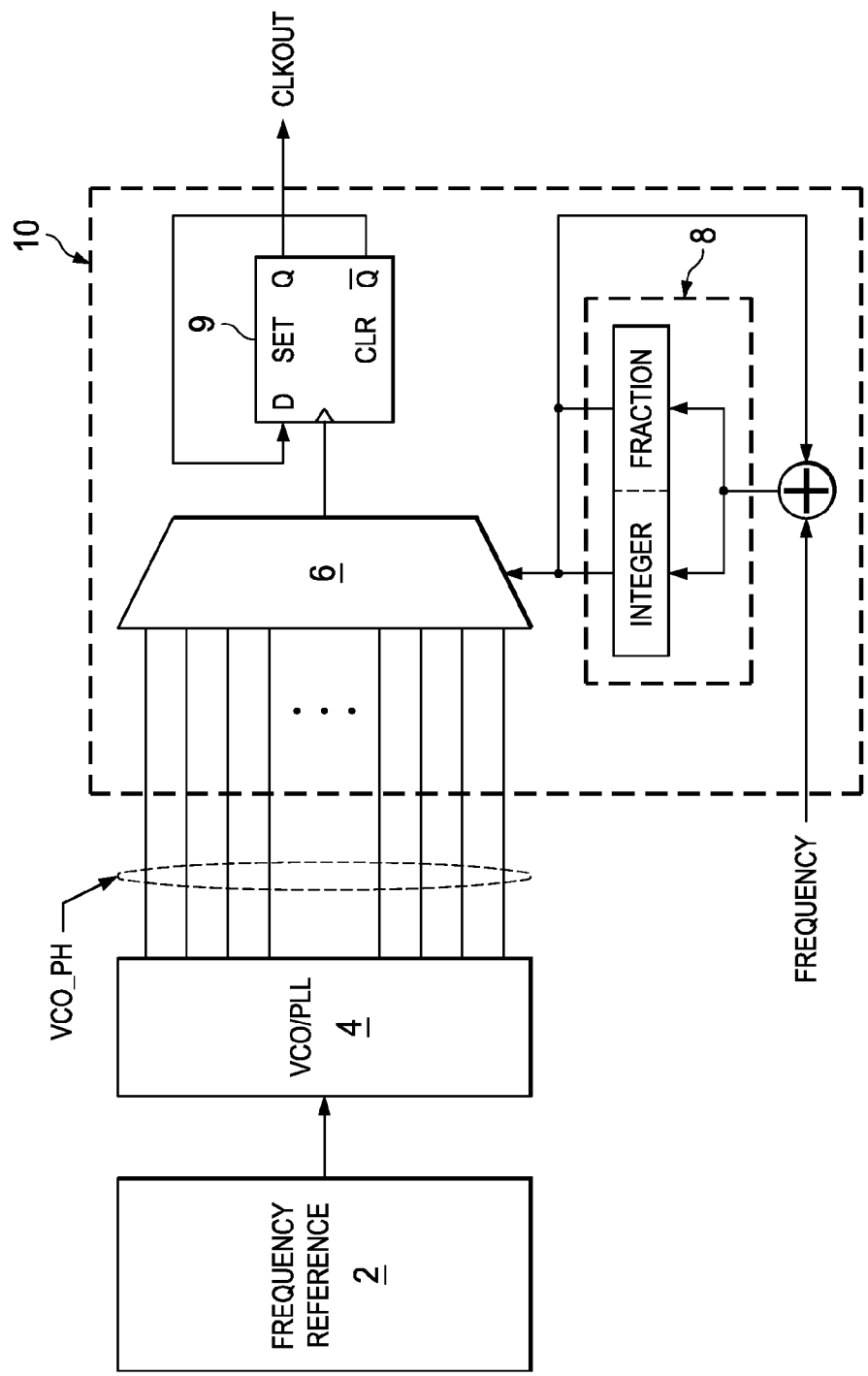
FIG. 1 is an electrical diagram, in block and schematic form, of a conventional flying-adder frequency synthesizer.

Flying-adder synthesizer 20 in this embodiment of the invention can be constructed according to any of the examples described above, including that described above relative to FIG. 1, or as described in the Mair and Xiu, and Xiu articles, in commonly assigned U.S. Pat. Nos. 6,329,850 B, 6,940,937 B2, 7,065,172 B2, 7,356,107 B2, and 7,372,340 B2; and in commonly assigned U.S. Patent Application Publication Nos. US 2007/0055718 A1 and 2008/0021944 A1, all incorporated by reference above. The construction of flying-adder synthesizer 20 is shown, in a general sense, in FIG. 5; it will be understood by those skilled in the art having reference to this specification and to the above-incorporated articles, patents, and patent application publications, that many variations on the flying-adder architecture may be used in flying-adder synthesizer 20, depending on the desired characteristics and design tradeoffs. In this general sense, flying-adder synthesizer includes multiplexer 44 that receives each of multiple phases generated by VCO 40 of PLL 23. The select input of multiplexer 44 is connected to the integer portion of the output of accumulator 46. Accumulator 46 repeatedly adds the current value of digital control word FREQ, including integer and fractional portions, to its current contents. In response to the value of the integer portion of the contents of accumulator 46, multiplexer 44 selects the corresponding phase output by VCO 40 for coupling to the clock input of D-type flip-flop 48, which is coupled to generate alternating levels at its output. The frequency of the signal at the output of flip-flop 48 is divided down by frequency divider 49 (of factor M) in this embodiment of the invention, to generate the output clock signal CLKOUT.

In operation, time-average frequency clock generation circuit 25 produces an output clock signal CLKOUT at a frequency determined by the value of digital control word FREQ and based on the input frequency from crystal oscillator 22. The value of digital control word FREQ generated by time stamp processor 32, as noted above, varies with the offset of the frequency indicated by the PCR in the received data stream, relative to the nominal frequency of 27 MHz in this example. By way of example, consider the case in which frequency divider 41 divides down the reference frequency set by crystal XTL (nominally at 27 MHz) by a factor P=2, and in which frequency multiplier 47 multiplies the frequency at the output of VCO 40 by a factor N=110. In that case, the frequency $f_{vco}$ of a selected phase at the output of VCO 40 will be N*(27 MHz)/P=1485 MHz. For the case in which VCO 40 outputs eight phases from which flying-adder synthesizer 20 can choose, the highest frequency ($f_{hi}$) that can be output by flying-adder synthesizer 20 is 11.880 GHz. In general, however, the frequency output from flying-adder synthesizer 20 will correspond to this highest frequency divided by the value of digital control word FREQ (i.e., (11880 MHz)/FREQ). This selected frequency is then divided down by a factor M=5 to produce output clock signal CLKOUT in this example, via frequency divider 49.

In this example, the recovered clock signal from the received MPEG2 input data stream (FIG. 4) is nominally at 27 MHz, but varies from the reference frequency set by crystal XTL by some offset as determined by time stamp processor 32 from the PCR in the received data stream. This offset may be due to variations in the recovered clock signal in the received data stream from nominal, or due to variations in the reference frequency set by crystal XTL from its nominal value. Indeed, the data stream clock rate produced by modern professional or studio grade video decoder equipment is relatively reliable and stable; often, the larger source of offset comes from the relatively loose tolerances in the reference frequency set by crystal XTL, and from temperature variations and aging effects in that reference frequency. Embodiments of this invention correct for distortion regardless of the cause, whether resulting from offset caused either by the recovered clock signal or from variations and drift in the reference frequency. In this embodiment of the invention, the value of digital control word FREQ generated by time stamp processor 32 is based on the relationship between the PCR frequency relative to that reference frequency. In summary, for the example of time-average frequency clock generation circuit 25 of FIG. 5, the frequency $f_{out}$ of clock signal CLKOUT is given by:

$$f_{out} = \frac{f_{hi}}{\left[FREQ * \left(1 + \frac{offset}{1000000}\right) * M\right]}$$

where the offset value is in ppm. In this example, if the desired frequency of clock signal CLKOUT for processing the payload of the input data stream is 216 MHz, and in which frequency $f_{hi}$ is 11.880 GHz, the value of digital control word FREQ for zero-offset that produces the 216 MHz clock signal CLKOUT would be 11, for the case in which factor M=5. For non-zero values of the offset detected by time stamp processor 32, the value of digital control word FREQ will be modulated by time stamp processor 32 to include a fractional portion so that clock signal CLKOUT approaches the desired frequency requested by the incoming data stream. An example of the relationship between offset values and the resulting attributes of clock signal CLKOUT in this case is provided in the following table:

| FREQ offset (PPM) | FREQ | $f_{out}$ (MHz) | frequency ratio $f_{hi}/f_{out}$ | output clock period | | | | $f_{out}$ cycles between jumps |
|---|---|---|---|---|---|---|---|---|
| | | | | $f_{hi}$ (cycles) | min (ns) | $f_{hi}$ (cycles) | $T_{max}$ (ns) | |
| −300 | 10.9967 | 216.065 | 54.984 | *54 | 4.5455 | 55 | 4.6296 | 60 |
| −250 | 10.9973 | 216.055 | 54.986 | *54 | 4.5455 | 55 | 4.6296 | 71 |
| −200 | 10.9978 | 216.043 | 54.989 | *54 | 4.5455 | 55 | 4.6296 | 91 |
| −150 | 10.9984 | 216.032 | 54.992 | *54 | 4.5455 | 55 | 4.6296 | 122 |
| −100 | 10.9989 | 216.022 | 54.995 | *54 | 4.5455 | 55 | 4.6296 | 181 |
| −50 | 10.9995 | 216.011 | 54.997 | *54 | 4.5455 | 55 | 4.6296 | 357 |
| 0 | 11.0000 | 216.000 | 55.000 | 55 | 4.6296 | 55 | 4.6296 | — |
| +50 | 11.0006 | 215.989 | 55.003 | 55 | 4.6296 | *56 | 4.7138 | 357 |
| +100 | 11.0011 | 215.978 | 55.005 | 55 | 4.6296 | *56 | 4.7138 | 181 |
| +150 | 11.0017 | 215.968 | 55.008 | 55 | 4.6296 | *56 | 4.7138 | 122 |
| +200 | 11.0022 | 215.957 | 55.011 | 55 | 4.6296 | *56 | 4.7138 | 91 |
| +250 | 11.0028 | 215.945 | 55.014 | 55 | 4.6296 | *56 | 4.7138 | 71 |
| +300 | 11.0033 | 215.935 | 55.016 | 55 | 4.6296 | *56 | 4.7138 | 60 |

(the * indicates "jump cycle")

Jump cycles of prolonged period are indicated in this table by the asterisk. As evident from these results, non-zero values of the offset will result in cycles of the output signal CLKOUT of different periods, as measured in the number of minimum cycle periods at frequency $f_{hi}$ (i.e., of the minimum period defined by the time between adjacent VCO phases). The frequency of non-standard cycles (i.e., cycles of a period other than 55 cycles at $f_{hi}$) increases with increasing absolute value of the offset. For example, an offset value of +200 ppm results in 90 cycles of nominal period (55 cycles at $f_{hi}$) and one cycle at a "jump" cycle of prolonged period (56 cycles at $f_{hi}$). In that example, the output clock period would be:

$$T_{out} = \frac{\left[\left(90 * \frac{55}{f_{hi}}\right) + \left(1 * \frac{56}{f_{hi}}\right)\right]}{91}$$

$$= 4.6305 \text{ nsec}$$

$$= \frac{1}{215.9568 \text{ MHz}}$$

As described above, it is these "jump" cycles, caused by the accumulation of the fractional portions of the digital control word FREQ within flying-adder synthesizer 20, that can cause distortion in further processing clocked by clock signal CLKOUT, for example as evident in the signal at the output of DAC 36, especially in sensitive high frequency applications such as the RF processing of video and audio signals. In effect, the "jump" cycles serve to compensate accumulated phase error in the generated clock signal caused by the series of nominal period cycles differing from the desired output frequency. Referring to the above table, for negative offset values, each of the nominal cycles (of a period corresponding to 55 cycles at $f_{hi}$) produces a minor positive polarity phase error relative to the desired 216 MHz output signal; those minor positive polarity phase errors accumulate until compensation by the occurrence of a jump cycle of the shortened period (e.g., 54 cycles at $f_{hi}$). Conversely, for positive offset values, each of the nominal cycles (e.g., 55 cycles at $f_{hi}$) produces a minor negative polarity phase error relative to the desired 216 MHz output signal; those minor negative polarity phase errors accumulate until compensation by the occurrence of a jump cycle of the prolonged period (e.g., 56 cycles at $f_{hi}$). According to embodiments of this invention, jitter precorrection filter 35 is provided in advance of downstream functions (e.g., DAC 36) to correct the signals being processed for the effects of the major compensating phase changes applied by these jump cycles, and also for the effects of the minor phase error resulting from each of the nominal cycles.

In this embodiment of the invention, jitter precorrection filter 35 is realized as an all-pass polyphase variable delay digital filter, of the finite impulse response (FIR) type. The order of this FIR filter depends on the desired characteristics, as may be limited by computational complexity and also by the tolerable propagation delay. The jitter precorrection applied by filter 35 is in the form of a variable delay (i.e., group delay) that compensates for the expected variations in the periods of clock signal CLKOUT due to accumulation of the fractional portion of digital control word FREQ, within flying-adder synthesizer 20 (and the prolonged cycle upon a carry into the integer portion). To accomplish this controlled variable delay, the coefficients of this FIR filter are calculated according to the instantaneous selected phase from VCO 40 (communicated on lines _phase_ in FIG. 4), and according to the recovered frequency of the input data stream as indicated by the fractional portion of the digital control word FREQ from time stamp processor 32.

Offset computation function 24 calculates an offset value, in this embodiment of the invention, based on the most significant portion of the fractional part of digital control word FREQ, and forwards that value to jitter precorrection filter 35 on lines _offset_. This offset value corresponds to the recovered frequency, and can also compensate for other delay effects such as pipeline delays in jitter precorrection filter 35 and in the clock distribution circuitry, as well as compensating for setup time in DAC 36. It is contemplated that offset computation function 24 may be realized in various ways, including for example as a look-up table of offset values addressable according to the value of the most significant fraction portion of the digital control word FREQ; of course, specific programmable or custom logic can also be used to realize offset computation function 24. Coefficient register 27 is a programmable register that stores a scaling factor, which is communicated to jitter precorrection filter 35 on lines _coeff_; if this scaling factor is set to zero, jitter precorrection filter 35 is effectively bypassed and becomes a fixed delay stage.

Figure 6:
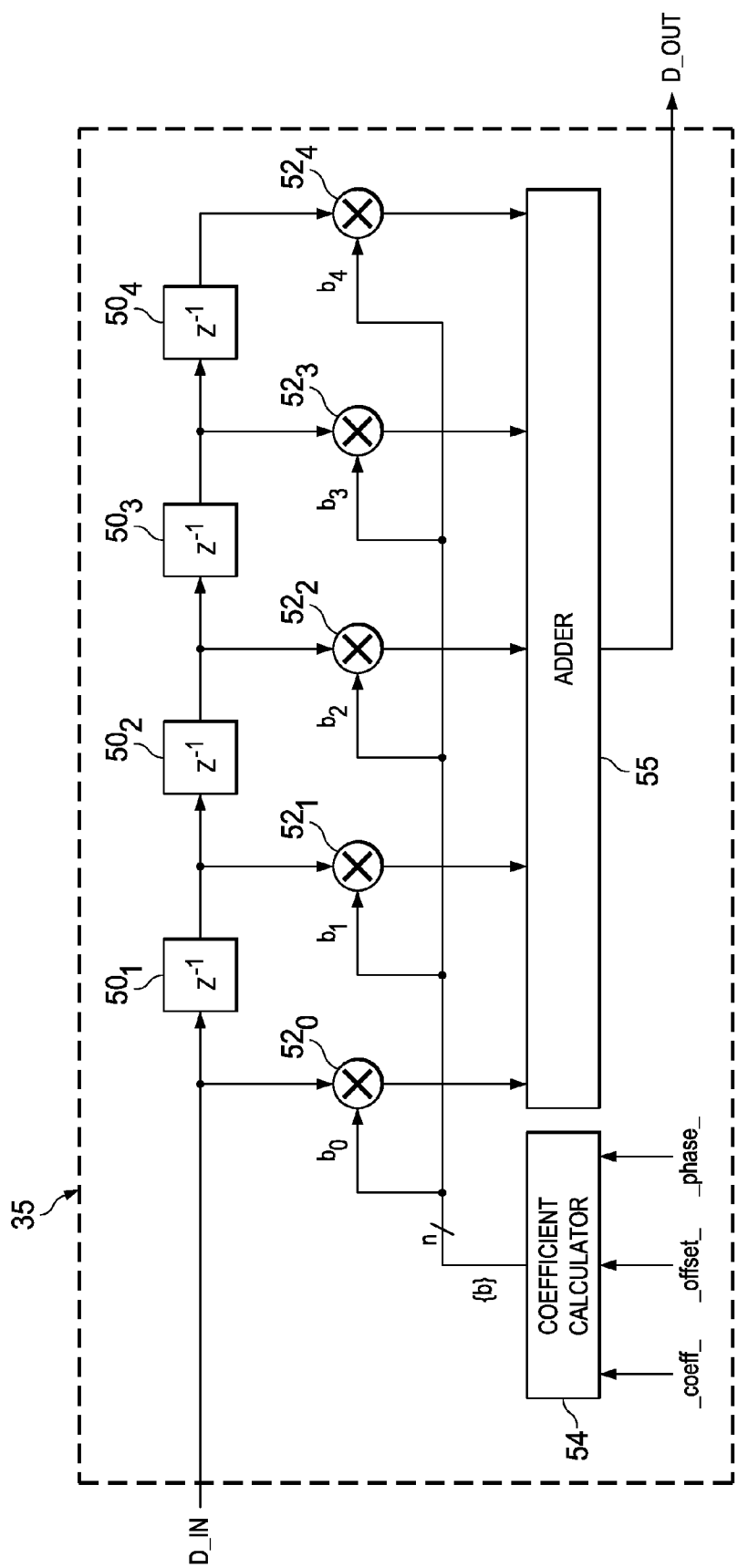
FIG. 6 is an electrical diagram, in block form, of a precorrection jitter filter in the receiver of FIG. 4 according to an embodiment of the invention.

FIG. 6 illustrates the functional arrangement of an example of jitter precorrection filter 35 according to an embodiment of the invention. Each function in jitter precorrection filter 35 is clocked synchronously with clock signal CLKOUT generated by time-average frequency synthesizer circuit 25. Input data lines D_IN provide the data stream from RF modulator 34 to delay stage $50_1$, which is the first in a series of delay stages $50_1$ through $50_4$ in this 5-tap example of jitter precorrection filter. Input data lines D_IN are also applied to multiplier $52_0$ as a first tap in filter 35, for multiplication by coefficient $b_0$ from coefficient calculator 54. Each of multipliers $52_1$ through $52_4$ receives the output of a corresponding one of delay stages $50_1$ through $50_4$, and multiplies that value by a corresponding coefficient $b_1$ through $b_4$ from coefficient calculator 54. Adder 55 receives the outputs of multipliers $52_0$ through $52_4$, and in each cycle of clock signal CLKOUT sums these values to produce a data value on lines D_OUT, for conversion by downstream DAC 36. Coefficient calculator 54 generates the set {b} of coefficients for jitter precorrection filter 35 based on the offset value communicated on lines _offset_, and the on VCO phase currently selected by flying-adder synthesizer 20 and indicated on lines _phase_, scaled by the programmable scaling coefficient stored in coefficient register 27 (FIG. 4) and communicated on lines _coeff_.

In this embodiment of the invention, offset computation 24 receives the digital control word FREQ value, and generates the value _offset_ applied to coefficient calculator 54 from that value and from the expected propagation (pipeline) delay ($delay_{pipeline}$) through jitter precorrection filter 35, and the setup time of DAC 36 ($DAC_{setup}$). For example, the value _offset_ calculated by offset computation function 24 follows:

$$\_offset\_ = -128 + 7*256*(delay_{pipeline} + DAC_{setup})*\\(FREQ - FREQ_{ideal})$$

The value FREQ constitutes the actual value of digital control word FREQ as indicated by the most significant portion of the fractional part of digital control word FREQ, and the value $FREQ_{ideal}$ indicates the value of digital control word FREQ at zero offset. This value offset is bounded within the range $-128 < offset \leq +127$ by adding or subtracting 256 from the calculated offset value if below or above the limits of this range, respectively.

The coefficients {b} applied by jitter precorrection filter 35 are calculated to provide the desired filter characteristics that compensate for the expected distortion caused by the prolonged or shortened cycles of clock signal CLKOUT generated in the time-average frequency sense. In a general sense, these desired filter characteristics amount to an all-pass filter of constant gain (e.g., unity gain) and of a linear phase delay (i.e., constant group delay), over the frequencies of interest, that varies to compensate for variations in the period of clock signal CLKOUT. In effect, the operation of jitter precorrection filter 35 is to variably delay the data stream so that the filtered data reflects the values that the sampled data would have if all clock cycles had an identical duration. In one example, coefficients {b} are calculated from a combination of the currently-selected phase from VCO 40 and the value _offset_ of:

$$mod_{phase} = (\_phase\_ + \_offset\_)$$

In essence, knowledge of the currently selected phase from VCO 40 and also the most significant fractional portion of the digital control word FREQ (which is reflected in the value _offset_) provides the ability to determine the proximity of the current clock cycle to a "jump" cycle (i.e., a prolonged or shortened cycle), and thus to systematically determine the delay to be inserted by jitter precorrection filter 35 in order to correct the digital data values for the expected jitter.

In this example in which jitter precorrection filter 35 is a fifth-order (i.e., five-tap) FIR filter, coefficients {b} are calculated as:

$$b_0 = \frac{-mod_{phase}}{256} * \frac{\_coeff\_}{4096}$$

$$b_1 = (-2.75) * \frac{-mod_{phase}}{256} * \frac{\_coeff\_}{4096}$$

$$b_2 = 1$$

$$b_3 = \frac{+mod_{phase}}{256} * \frac{\_coeff\_}{4096}$$

$$b_4 = (+2.75) * \frac{-mod_{phase}}{256} * \frac{\_coeff\_}{4096}$$

It is contemplated that those skilled in the art having reference to this specification will be able to similarly derive coefficients for a digital implementation of jitter precorrection filter 35, of the desired order and desired performance, as optimized for their particular realizations. In any event, it is contemplated that these coefficients will usefully depend on the instantaneous selected phase from the VCO of the PLL, and a measure of the offset between the recovered clock frequency and the ideal (zero offset) reference frequency.

Figure 7A:
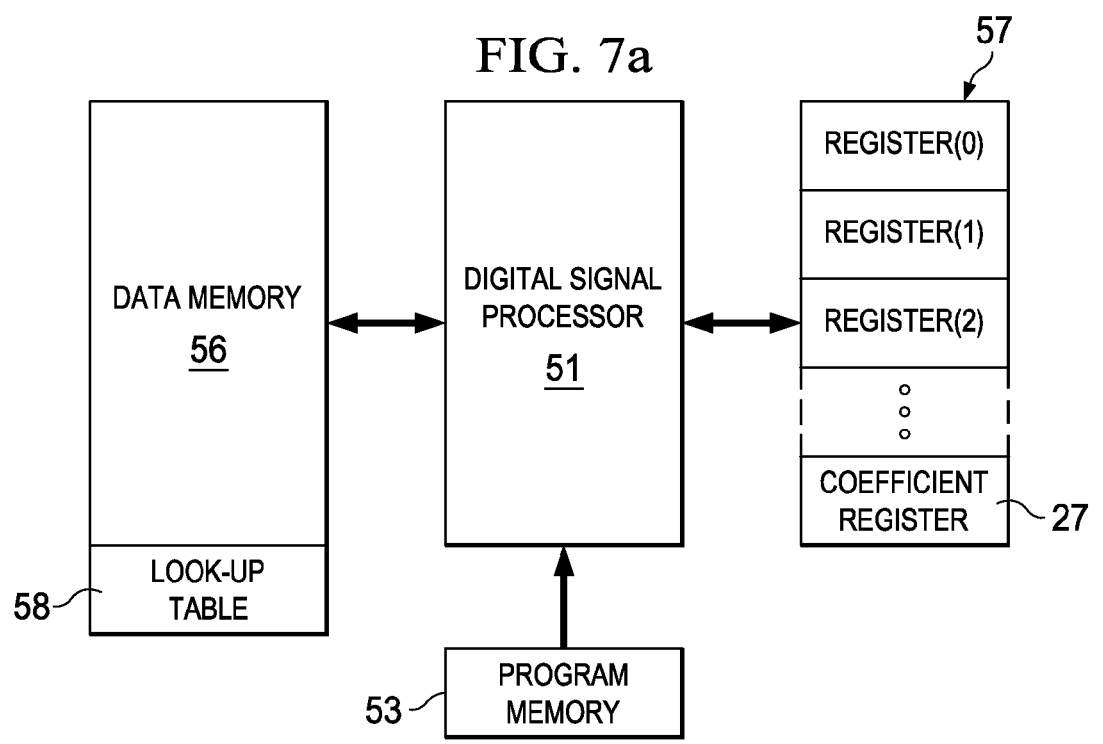
FIGS. 7a and 7b are electrical diagrams, in block and schematic form, of the construction of precorrection jitter filter in the receiver of FIG. 4 according to embodiments of the invention.

Embodiments of this invention, and particularly jitter precorrection filter 35, may be implemented in various ways. As known in the digital filter art, jitter precorrection filter 35 may be implemented in software as instructions for a digital signal processor or other programmable logic that execute the desired data processing required for implementing the precorrection function. Such an arrangement is illustrated in a general manner in FIG. 7a, by way of which digital signal processor 51 is realized by a digital signal processor (DSP) core (whether realized as a standalone circuit or as a function within a larger-scale integrated circuit), or by other programmable logic capable of carrying out the calculations and operations involved in the operation of this embodiment of the invention. Program memory 53 stores software instructions executable by digital signal processor 51 to perform the functions of jitter precorrection filter 35, including the multiply and add operations on the values of the received data stream, and also including the function of coefficient calculator 54 to determine the filter coefficients {b}. In the generalized architecture of FIG. 7a, data memory 56 and register file 57 are also provided, for storing the input digital data values to jitter precorrection filter 35 and also the output digital data values from filter 35. A portion of data memory 56 may constitute look-up table 58 that stores sets of filter coefficients {b} corresponding to, and addressable by, the most significant fractional portion of digital control word FREQ, for example. The selection of whether the payload data values are stored into and retrieved from addressable data memory 56 or into or from register file 57 is left to the programmer, as known in the art. In the particular example of FIG. 7a, coefficient register 27 is provided as one of the registers in register file 57. Numerous variations and alternatives to the generalized architecture of FIG. 7a are, of course known in the art, including the use of a unitary memory space for both program and data memory, and the like. In addition, it is contemplated that digital signal processor 51 realizing jitter precorrection filter 35 may be the same physical programmable logic that carries out other functions within the system, including digital functions involved in RF modulator 34 in the system of FIG. 4, and also offset computation 24. These and other alternative implementations will be apparent to those skilled in the art having reference to this specification.

Figure 7B:
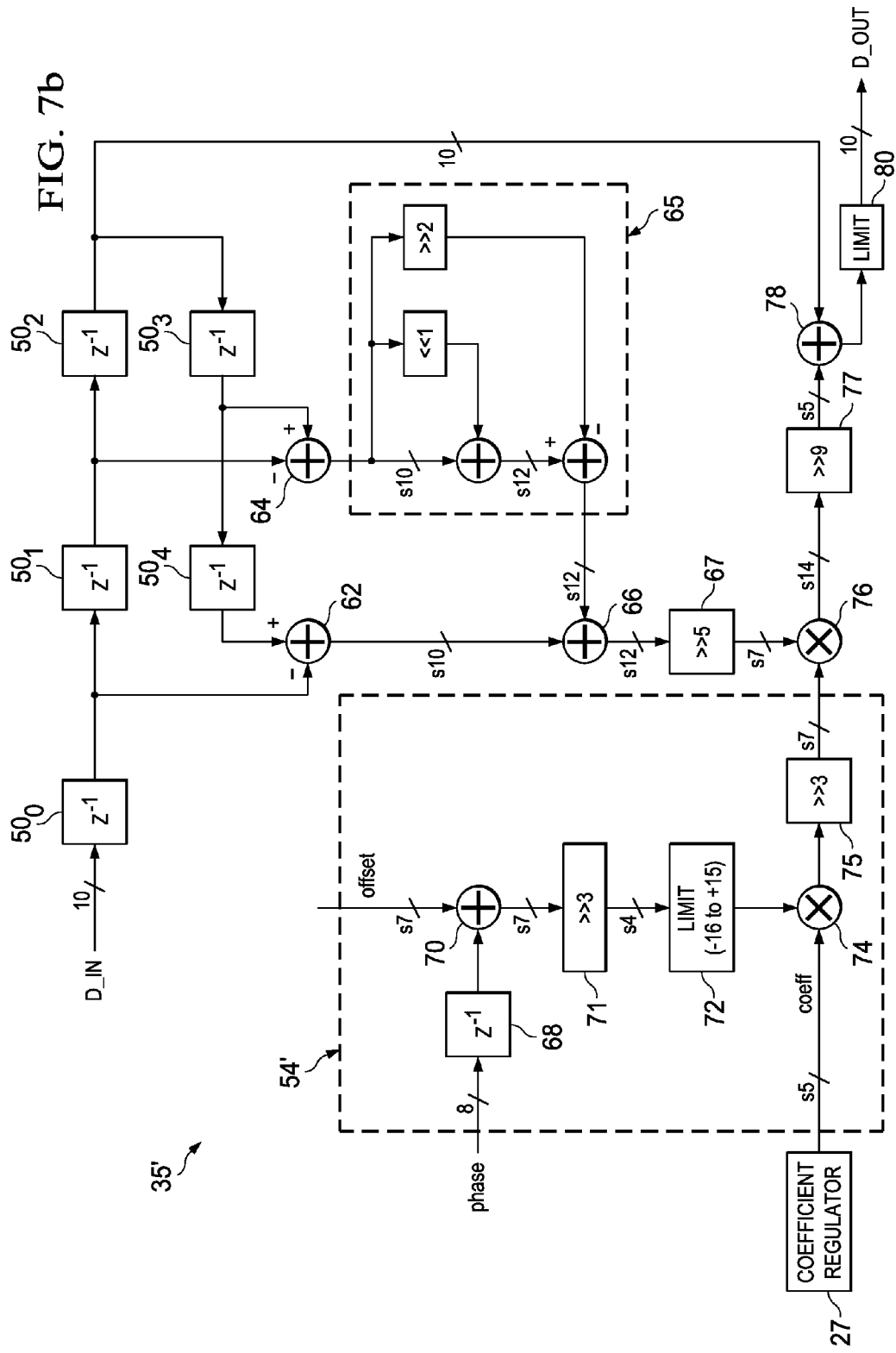

Alternatively, and particularly in the case in which the expected recovered clock frequency is within a relatively small range about a constant reference frequency (e.g., a crystal reference frequency), jitter precorrection filter 35 may be realized entirely in hardware, by way of customized logic circuitry that respond to input variables such as the scaling coefficient, instantaneous selected phase, and the indicated offset. FIG. 7b illustrates jitter precorrection filter 35' realized in such a hardware-based fashion, as will now be described.

In this hardware realization, delay stages $50_0$ through $50_4$ are connected in sequence to input data lines D_IN; first delay stage $50_0$ is not part of jitter precorrection filter 35', but provides a buffer stage for the data stream received from RF modulator 34 (FIG. 4). In this example, the outputs of delay stages $50_0$ through $50_4$ in this realization of filter 35' are combined with one another and with the values _offset_ and _coeff_, and with the currently-selected phase on lines _phase_, according to the characteristic:

$$\frac{\text{D\_OUT}(n)}{\text{N\_IN}(n)} = \frac{(\_\text{phase}\_ + \_\text{offset}\_)}{256} * \_\text{coeff}\_ * \frac{[(z^{-4} - 1) + 2.75(z^{-3} - z^{-1})]}{4096} + z^{-2}$$

This filter characteristic corresponds to the example of coefficients {b} for the five-tap realization of jitter precorrection filter 35 described above, but is factored for hardware efficiency. In particular, this factorization allows coefficient calculator 54' of FIG. 7 to combine the values on lines _offset_, _phase_, and _coeff_ into one factor, while permitting delay stages $50_0$ through $50_4$ to combine the delayed data stream values independently from those values on lines _offset_, _phase_, and _coeff_ to the extent possible. In the realization of FIG. 6, the output of delay stage $50_0$ is subtracted from the output of delay stage $50_4$ by adder 62, and the output of delay stage $50_1$ is subtracted from the output of delay stage $50_3$ by adder 64. The output of adder 64 is then multiplied by a factor 2.75 by the operation of circuitry 65, which adds that value shifted-left by one binary place (x2) to the value itself (x1), and then subtracts that value shifted right by three binary places (x0.25). The result from circuitry 65 is summed with the output of adder 62, divided by thirty-two by right-shift 67, and applied to one input of multiplier 76. This result is independent of the values on lines _offset_, _phase_, and _coeff_.

The other input to multiplier 76 is generated by coefficient calculator 54', which in this case is realized by adder 70 adding the current offset value to the currently selected phase, delayed by one cycle by delay stage 68 (corresponding to the buffer of delay stage $50_0$). Right-shift 71 divides that sum by eight, and limit function 72 bounds the resulting value to between −16 and +15. The contents of scaling coefficient register 27 are multiplied by the output from limit function 72, and the result is bit-aligned by right-shift 75 before being applied to that other input of multiplier 76. In this example, the offset and coeff values, and also the outputs of the various adders within jitter precorrection filter 35 are treated as signed binary values (as indicated by the "s" prefix to the bit widths shown in FIG. 7b). A default value for the value coeff in this example is +38. The product generated by multiplier 76 is bit-aligned by right-shift 77 and summed with the output of delay stage $50_2$ by adder 78. That result is clipped by limit function 80 into the appropriate range of values, and is then presented on data lines D_OUT to downstream circuitry, such as DAC 36 in this case.

If no frequency offset is present (i.e., the recovered clock frequency is aligned with the reference clock frequency), then digital control word FREQ will have a zero-valued fractional part. Flying-adder synthesizer 20 will, in that event, always select the same VCO phase, and no jump cycles will be present. While jitter precorrection filter 35 will still be present in the datapath, it will have the effect of applying a fixed delay over all data values, rather than of applying a variable delay to the data stream.

As will be recognized by those skilled in the art having reference to this specification, the hardware implementation of jitter precorrection filter 35' illustrated in FIG. 7 and described above is relatively efficient in terms of hardware and computational complexity. It is therefore contemplated that the jitter precorrection filter of the embodiments of this invention can provide excellent compensation for the expected varying-cycle jitter of time-averaged frequency clock generation, with minimal propagation delay and performance impact, even for high bandwidth applications such as video decoding.

Figure 8A:
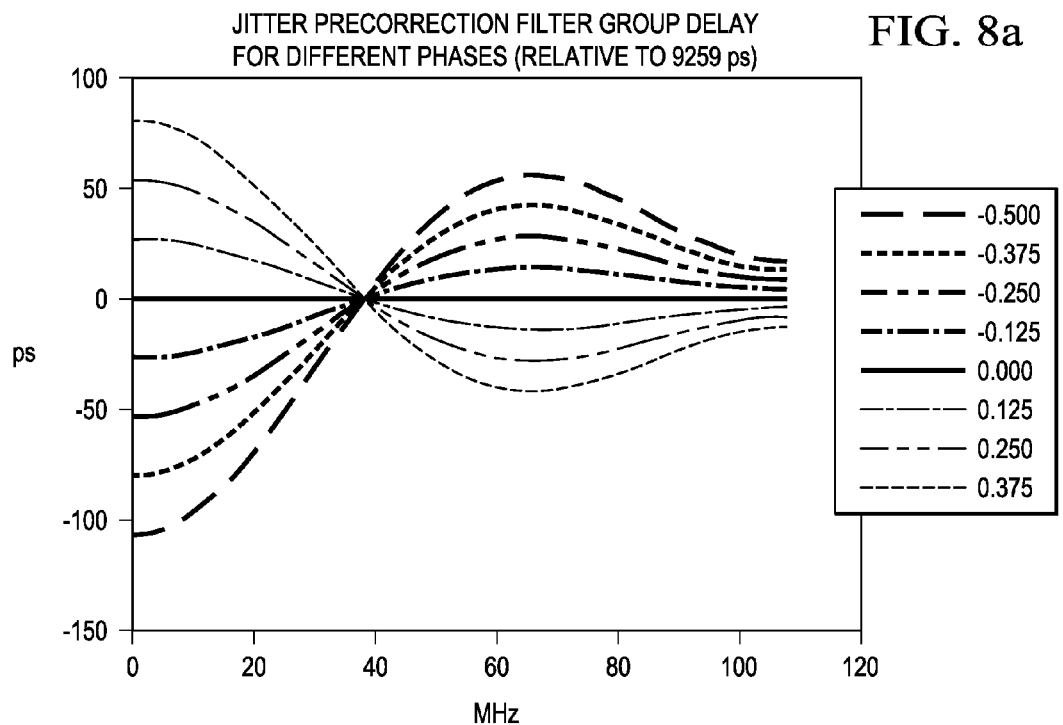
FIGS. 8a and 8b are plots of group delay over frequency.
Figure 8B:
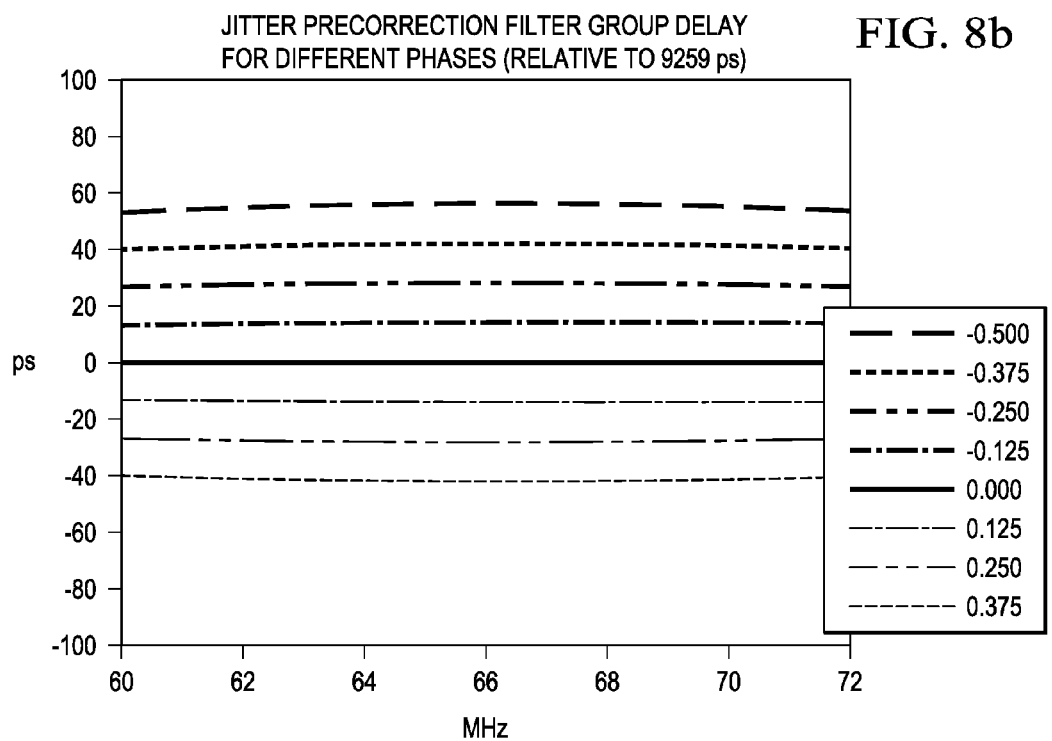
Figure 8C:
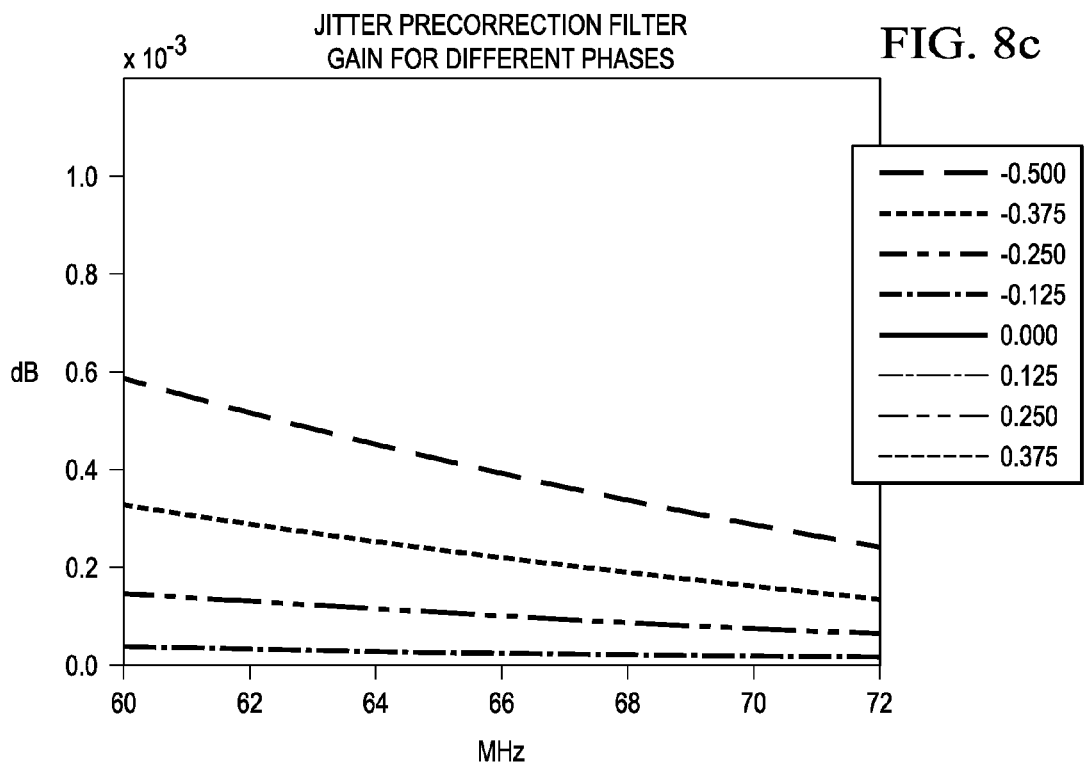
FIG. 8c is a plot of gain over frequency, for each of the multiple clock phases generated within the time-average frequency synthesis circuit in the system of FIG. 4, according to an example of an embodiment of the invention.

As mentioned above, the currently-selected phase from VCO 40 in time-average frequency synthesis circuit 25 is an input into coefficient calculator 54. This phase, in combination with the fractional portion of digital control word FREQ, determines the relative proximity of a jump cycle in the clock signal CLKOUT. In effect, jitter precorrection filter 35, 35' utilizes these inputs to determine the magnitude and polarity of group delay to insert into the data path in order to compensate for the change in clock period of such a jump cycle. For the example described above in connection with FIG. 7, FIGS. 8a and 8b illustrate the group delay over frequency for each of the eight VCO phases, ranging from −0.500 cycles to +0.375 cycles in 0.125 cycle increments. In the example of the video decoder of FIG. 4, in which RF modulation of the digital data into an analog signal that modulates carrier frequencies corresponding to VHF channels 3 and 4 (i.e., about 60 MHz to about 72 MHz), this filter characteristic provides excellent separation in group delay from among the eight phases. FIG. 8b more closely illustrates the group delay over that frequency range of interest for each of the eight phases. As shown in FIG. 8b, the group delay is essentially constant over frequency within that range of 60 to 72 MHz, but varies from +55 psec for the −0.500 cycle phase to −40 psec for the +0.375 cycle phase. FIG. 8c illustrates that the gain of jitter precorrection filter 35 in this example is relatively flat over frequency for each phase, and at similar gain values for each of the phases; the variations shown in FIG. 8c over the frequencies of interest are believed to be adequate for many modern applications, including high-performance video decoders such as that described above relative to FIG. 4.

Figure 3:
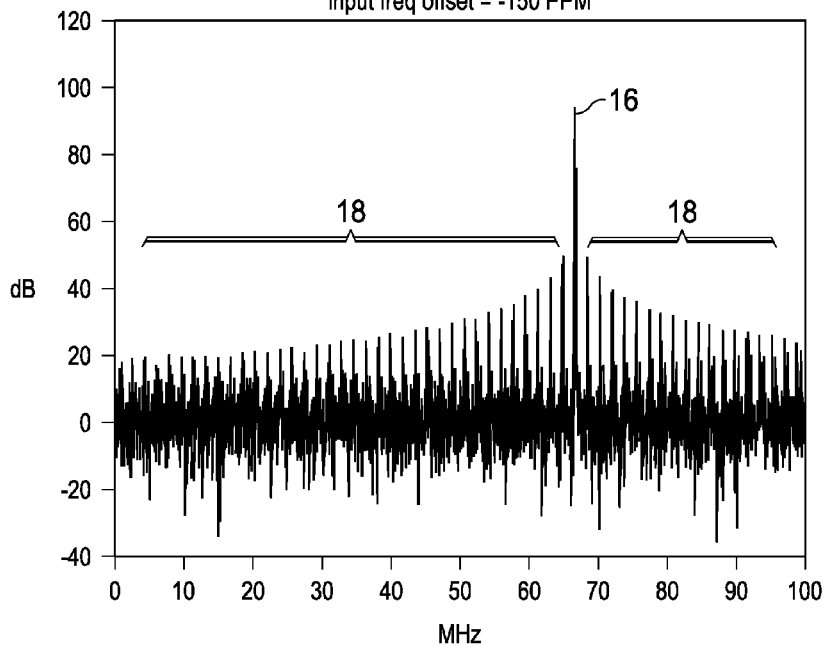
FIG. 3 is a plot of a frequency spectrum indicating the effects of time-average-frequency as produced by the frequency synthesizer of FIG. 1.
Figure 9:
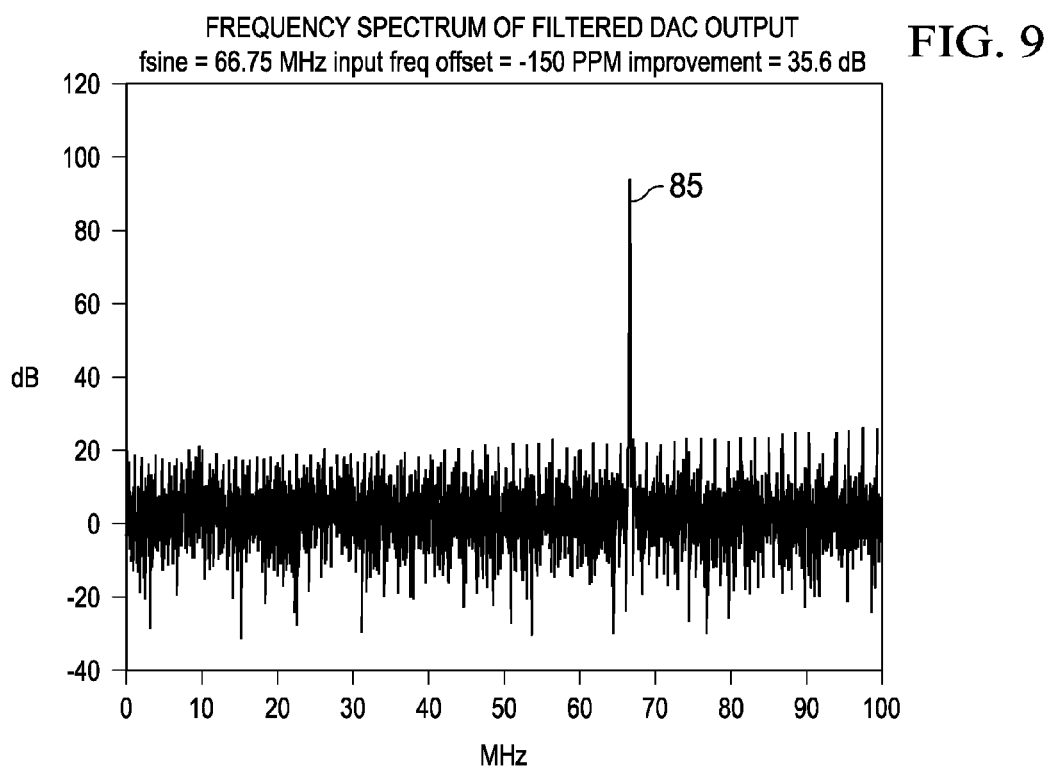
FIG. 9 is a plot of a frequency spectrum indicating the effects of time-average-frequency as compensated by precorrection jitter filtering according to an embodiment of the invention.

FIG. 9 illustrates the frequency spectrum at DAC 36 in another example of a video decoder including jitter precorrection filter 35 constructed according to an embodiment of this invention. In the example of FIG. 8, the offset in the input frequency indicated by digital control word FREQ is −150 ppm relative to the nominal PCR frequency of 27 MHz, as in the example exhibiting the spectrum of FIG. 3. And, as in the case of FIG. 3, peak 85 shows the dominant frequency component at this desired frequency of 66.75 MHz. However, due to the presence of jitter precorrection filter 35 according to an embodiment of this invention, the amplitude of jitter-caused peaks resulting from varying-cycle jitter in the flying-adder clock generation circuit is much reduced in the spectrum of FIG. 9. Comparison of this spectrum of FIG. 9 to the spectrum from conventional decoder and DAC circuitry shown in FIG. 3, illustrates the important improvement provided by embodiments of this invention. More specifically, in this example, the improvement in the amplitude of those jitter-caused peaks is about 35.6 dB.

According to embodiments of this invention, therefore, synchronous circuit and system functions can be efficiently implemented according to the advantages provided by time-average frequency synthesis techniques, but without the distortion caused by the expected prolonged or shortened cycles, such distortion being especially apparent in high-performance applications. The accuracy of system operation is thus optimized while still obtaining the cost and complexity advantages of the time-average frequency techniques.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. Circuitry for synchronously processing a sequence of digital data values, comprising:
    time-average frequency clock generation circuitry for generating a clock signal of varying period, the clock signal exhibiting a desired frequency on the average over time;
    processing circuitry, clocked by the clock signal from the time-average frequency clock generation circuitry; and
    a jitter precorrection filter having an output coupled to the input of the processing circuitry, the jitter precorrection filter applying a variable delay to the received sequence of digital data values, the variable delay corresponding to the varying period of the clock signal.

2. The circuitry of claim 1, wherein the time-average frequency clock generation circuitry comprises:
    a phase-locked loop generating a plurality of clock phases;
    a multiplexer coupled to the phase-locked loop to select among the plurality of clock phases responsive to a control input;
    an accumulator storing contents having integer and fractional portions, for repetitively adding a digital control word value with its contents, the accumulator having an output for coupling the integer portion of its contents to the control input of the multiplexer; and
    circuitry for generating the clock signal responsive to the selected clock phases.

3. The circuitry of claim 2, wherein the jitter precorrection filter comprises:
    a digital filter function applying a set of filter coefficients to selected data values in the sequence; and
    a coefficient calculator function for determining the filter coefficients responsive to at least a portion of a fractional portion of the digital control word value and to a currently selected clock phase.

4. The circuitry of claim 3, wherein the digital filter function is a Finite Impulse Response digital filter.

5. The circuitry of claim 3, wherein the jitter precorrection filter comprises:
    programmable logic circuitry; and
    program memory, coupled to the programmable logic circuitry, for storing computer program instructions that, when executed by the programmable logic circuitry, cause the programmable logic circuitry to perform the digital filter function and the coefficient calculator function.

6. The circuitry of claim 2, wherein the jitter precorrection filter comprises
    a plurality of delay stages, coupled in sequence, a first one of the plurality of delay stages coupled to receive the sequence of digital data values;
    a plurality of adders, each having inputs coupled to outputs of selected ones of the plurality of delay stages, for combining digital values presented at those outputs according to a filter characteristic;
    coefficient calculator circuitry, for combining digital values representative of at least a portion of a fractional portion of the digital control word value and to a currently selected clock phase; and
    circuitry for combining digital values from the output of the coefficient calculator circuitry and the plurality of adders to produce a sequence of filtered digital data values for application to the processing circuitry.

7. The circuitry of claim 2, further comprising:
    a frequency reference, coupled to the phase-locked loop; and
    circuitry for determining the digital control word value responsive to a relationship between an input frequency of a data stream containing the received digital data values and the reference frequency of the frequency reference;
    wherein the jitter precorrection filter comprises:
        a digital filter function applying a set of filter coefficients to selected data values in the sequence; and
        a coefficient calculator function for determining the filter coefficients responsive to a most significant fractional portion of the digital control word value, and to a currently selected clock phase.

8. The circuitry of claim 7, further comprising:
    offset computation circuitry, for computing an offset value responsive to the most significant fractional portion of the digital control word value and corresponding to circuit delay times;
    wherein the coefficient calculator function determines the filter coefficients responsive to the offset value and to the currently selected clock phase.

9. A video decoder system, comprising:
    time-average frequency clock generation circuitry for generating a clock signal of varying period, the clock signal exhibiting a desired frequency on the average over time;
    an RF modulator having an receiving an input data stream comprising a sequence of payload digital data values, and a program clock reference, the RF modulator for producing a sequence of digital data values synchronously with the clock signal;
    a digital-to-analog converter, clocked by the clock signal; and
    a jitter precorrection filter having an output coupled to the input of the digital-to-analog converter, the jitter precorrection filter applying a variable delay to the sequence of digital data values from the RF modulator, the variable delay corresponding to the varying period of the clock signal.

10. The system of claim 9, wherein the time-average frequency clock generation circuitry comprises:
    a phase-locked loop generating a plurality of clock phases;
    a multiplexer coupled to the phase-locked loop to select among the plurality of clock phases responsive to a control input;

an accumulator storing contents having integer and fractional portions, for repetitively adding a digital control word value with its contents, the accumulator having an output for coupling the integer portion of its contents to the control input of the multiplexer; and circuitry for generating the clock signal responsive to the selected clock phases.

11. The system of claim 10, wherein the jitter precorrection filter comprises:

a digital filter function applying a set of filter coefficients to selected data values in the sequence; and a coefficient calculator function for determining the filter coefficients responsive to at least a portion of a fractional portion of the digital control word value and to a currently selected clock phase.

12. The system of claim 11, wherein the digital filter function is a Finite Impulse Response digital filter.

13. The system of claim 10, further comprising:

a frequency reference, coupled to the phase-locked loop; and circuitry for determining the digital control word value responsive to a relationship between an input frequency of a data stream containing the received digital data values and the reference frequency of the frequency reference;

wherein the jitter precorrection filter comprises:

a digital filter function applying a set of filter coefficients to selected data values in the sequence; and a coefficient calculator function for determining the filter coefficients responsive to a most significant fractional portion of the digital control word value, and to a currently selected clock phase.

14. The system of claim 13, further comprising:

offset computation circuitry, for computing an offset value responsive to the most significant fractional portion of the digital control word value and corresponding to circuit delay times;

wherein the coefficient calculator function determines the filter coefficients responsive to the offset value and to the currently selected clock phase.

15. A method of filtering a sequence of digital data values to correct for the effects of varying-cycle jitter in pulses of a clock signal generated by a time-average frequency clock generation circuit, comprising the steps of:

identifying a desired frequency for the clock signal;

generating a digital control word having integer and fractional portions, and of a value corresponding to the desired frequency relative to a reference frequency;

operating a flying-adder synthesis circuit to generate the clock signal by repetitively selecting one of a plurality of clock phases responsive to the value of an integer portion of accumulator contents, the accumulator contents corresponding repetitive adding of the digital control word into the accumulator;

for each digital data value in the sequence, determining coefficients for a digital filter responsive to the selected clock phase and responsive to at least a most significant fractional portion of the digital control word; and applying a digital filter to the sequence of digital data values.

16. The method of claim 15, wherein the identifying step comprises:

processing a program clock reference in an input data stream.

17. The method of claim 15, wherein the step of determining coefficients for the digital filter comprises:

computing an offset value responsive to the most significant fractional portion of the digital control word and including circuit delay times;

wherein the coefficients for the digital filter are determined responsive to the offset value.

18. The method of claim 15, further comprising:

performing digital-to-analog conversion of the filtered sequence of digital data values in a manner synchronous with the clock signal.

* * * * *